United States Patent
Honjo (10) Patent No.: US 7,375,286 B2
(45) Date of Patent: May 20, 2008

(54) PRINTED CIRCUIT BOARD AND MANUFACTURING METHOD THEREOF

(75) Inventor: Mitsuru Honjo, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 11/688,899

(22) Filed: Mar. 21, 2007

(65) Prior Publication Data

US 2007/0227764 A1 Oct. 4, 2007

(30) Foreign Application Priority Data

Apr. 3, 2006 (JP) .............................. 2006-101784

(51) Int. Cl.
  *H05K 1/03* (2006.01)
(52) U.S. Cl. ...................... 174/255; 174/250; 174/254; 174/261; 428/209; 428/210; 439/260; 361/792; 361/793; 361/794; 361/795
(58) Field of Classification Search ........ 174/250–255, 174/261; 428/209, 210, 195.1; 439/260; 361/792–795
See application file for complete search history.

(56) References Cited

U.S. PATENT DOCUMENTS

| 5,322,974 | A | * | 6/1994 | Walston ...................... 174/250 |
| 5,420,553 | A | * | 5/1995 | Sakamoto et al. ........... 333/172 |
| 5,608,192 | A | * | 3/1997 | Moriizumi et al. .......... 174/255 |
| 6,040,936 | A | * | 3/2000 | Kim et al. .................... 359/245 |
| 7,004,775 | B1 | * | 2/2006 | Sakurai et al. ............... 439/260 |
| 2004/0227669 | A1 | * | 11/2004 | Okado .................. 343/700 MS |
| 2004/0232415 | A1 | * | 11/2004 | Aoki et al. ..................... 257/53 |
| 2005/0001331 | A1 | * | 1/2005 | Kojima et al. ............... 257/778 |
| 2006/0068173 | A1 | * | 3/2006 | Kajiyama et al. ......... 428/195.1 |
| 2006/0141764 | A1 | * | 6/2006 | Oi et al. ...................... 438/622 |

FOREIGN PATENT DOCUMENTS

JP   2001339159 A   * 12/2001
JP   2004-88020 A     3/2004

* cited by examiner

*Primary Examiner*—Jeremy C. Norris
*Assistant Examiner*—Xiaoliang Chen
(74) *Attorney, Agent, or Firm*—Panitch Schwarze Belisario & Nadel LLP (57) ABSTRACT

A plurality of wiring patterns in a stripe form are formed to be parallel to one another on one surface of a base insulating layer. The wiring patterns each have a layered structure including a conductive layer and a wiring layer. A thin metal film is formed on the other surface of the base insulating layer, and a plurality of ground patterns in a stripe form are formed to be parallel to one another on the thin metal film. The wiring patterns and the ground patterns are provided in a staggered manner so that they are not opposed to one another with the base insulating layer interposed therebetween. In other words, the ground patterns are provided to be opposed to regions between the wiring patterns.

8 Claims, 8 Drawing Sheets

PRINTED CIRCUIT BOARD AND MANUFACTURING METHOD THEREOF

BACKGROUND OF THE INVENTION

1. Field of the Invention

The present invention relates to a printed circuit board and a manufacturing method thereof.

2. Description of the Background Art

A flexible printed circuit board that can be bent is used for a movable element in electronic equipment. The flexible printed circuit board for example has wiring patterns made of a conductor formed on one surface of an insulating layer and a ground layer formed on the other surface. The wiring patterns are connected to various kinds of electronic components and transmit electrical signals between these electronic components.

In the flexible printed circuit board, various techniques have been devised in the ground layer to secure necessary flexibility.

Figure 8:
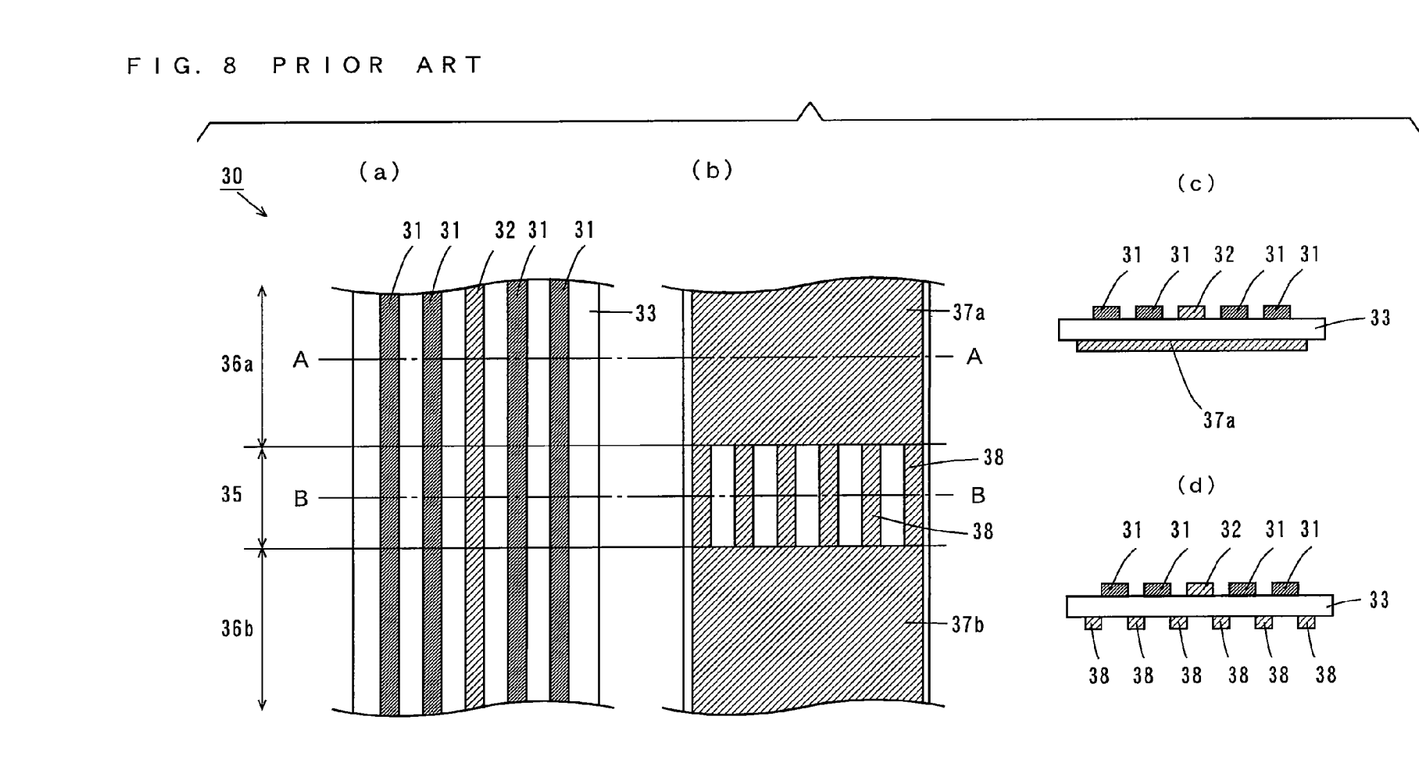
FIG. 8 is a view of the structure of a conventional printed circuit board.

FIG. 8 shows an example of a conventional flexible printed circuit board (see JP 2004-088020A). Hereinafter, the flexible printed circuit board will be abbreviated as "printed circuit board."

FIG. 8(a) is a plan view of a signal wiring surface in the printed circuit board, and FIG. 8(b) is a plan view of a ground wiring surface in the printed circuit board. FIG. 8(c) is a sectional view of the printed circuit board taken along line A-A in FIGS. 8(a) and 8(b), and FIG. 8(d) is a sectional view of the printed circuit board taken along line B-B in FIGS. 8(a) and 8(b).

As shown in FIG. 8, the printed circuit board 30 has a base 33. A front layer (see FIG. 8(a)) having signal lines 31 and a ground line 32 is formed on one surface of the base 33, and a backside layer (see FIG. 8(b)) having ground planes 37a and 37b and ground lines 38 is formed on the other surface of the base 33.

A bend portion 35 is provided in a prescribed region of the printed circuit board 30, and flat portions 36a and 36b are provided to extend on both sides of the bend portion 35.

As shown in FIG. 8(a), at the front layer, the signal lines 31 and the ground line 32 are provided at prescribed intervals in the length-wise direction of the printed circuit board 30.

As shown in FIG. 8(b), at the backside layer, the ground planes 37a and 37b are provided at the flat portions 36a and 36b, and the ground lines 38 are provided at the bend portion 35. The ground lines 38 electrically connect the ground planes 37a and 37b.

Here, as shown in FIG. 8(d), the ground lines 38 at the backside layer are provided in a staggered manner so as not to be opposed to the signal lines 31 at the front layer with the base 33 interposed therebetween.

In this way, the signal lines 31 at the front layer and the ground lines 38 at the backside layer are shifted so that they do not overlap. Therefore, if the printed circuit board 30 is bent at the bend portion 35, the printed circuit board 30 is less likely to be broken, and the signal lines 31 and the ground lines 38 are less likely to be disconnected.

If the wiring pattern transmits a high frequency signal, the characteristic impedance of the wiring pattern must be matched with the input/output impedance of an electronic component to be connected to the wiring pattern. If they do not match, a part of the electrical signal is reflected at the connection part between the wiring pattern and the electronic component, which degrades the transmission efficiency of the electrical signal.

In general, the characteristic impedance of the wiring pattern depends on the area of the region in which the wiring pattern and the ground layer are opposed to each other, and as the area of the region in which the wiring pattern and the ground layer are opposed to each other decreases, the characteristic impedance of the wiring pattern increases.

In the conventional flexible printed circuit board 30 shown in FIG. 8, the area of the region in which the signal lines 31 at the front layer and the ground layer at the backside layer (including the ground planes 37a and 37b and the ground lines 38) are opposed to one another is large at the flat portions 36a and 36b and small at the bend portion 35. Therefore, the characteristic impedance of the signal lines 31 greatly differ between the bend portion 35 and the flat portions 36a and 36b, which degrades the transmission efficiency of electrical signals.

In the conventional flexible printed circuit board 30, the flexibility at the bend portion 35 is secured while the flexibility of the flat portions 36a and 36b is not secured. Therefore, the region other than the bend portion 35 cannot be bent in use.

Meanwhile, it would be possible to form the ground lines 38 in a staggered manner with respect to the signal lines 31 at the flat portions 36a and 36b.

However, in this case, the region in which the ground layer (ground lines 38) and the signal lines 31 are opposed to one another is reduced. Therefore, the characteristic impedance of the signal line 31 increases. In this way, if the input/output impedance of an electronic component is low, the characteristic impedance of the signal line 31 cannot be matched to the input/output impedance of the electronic component.

SUMMARY OF THE INVENTION

It is an object of the invention to provide a printed circuit board in which sufficient flexibility can be secured and the characteristic impedance can be prevented from varying and reduced, and a manufacturing method thereof.

(1) A printed circuit board according to one aspect of the invention includes an insulating layer, a plurality of wiring patterns formed at prescribed intervals on one surface of the insulating layer, a thin metal film formed on the other surface of the insulating layer, and a plurality of ground patterns formed at prescribed intervals on the thin metal film and having a thickness larger than that of the thin metal film, and the plurality of ground patterns are provided to be opposed to regions between the plurality of wiring patterns with the insulating layer and the thin metal film interposed therebetween.

In this printed circuit board, the thin metal film is formed on the other surface of the insulating layer, the ground patterns are formed to be opposed to regions between the plurality of wiring patterns with the insulating layer and the thin metal film interposed therebetween, and therefore the flexibility of the printed circuit board can be secured, while the characteristic impedance of the wiring pattern can be reduced.

The thin metal film is formed on the other surface of the insulating layer, and the plurality of ground patterns are formed on the thin metal film, so that variations in the characteristic impedance of the wiring pattern can be reduced, and the printed circuit board can be bent in a desired position.

(2) The ground patterns may be provided not to be opposed to the plurality of wiring patterns. In this way, the flexibility of the printed circuit board can be further improved.

(3) The plurality of wiring patterns may extend in a stripe form on one surface of the insulating layer, and the plurality of ground patterns may extend in a stripe form on the other surface of the insulating layer. In this way, the thin metal film is formed on the other surface of the insulating layer and the plurality of stripe-shaped ground patterns are formed to be opposed to the stripe-shaped regions between the plurality of stripe-shaped wiring patterns with the insulating layer and the thin metal film interposed therebetween. Therefore, the flexibility of the printed circuit board can be secured, and the characteristic impedance of the wiring pattern can be reduced.

(4) The thickness of the thin metal film may be at most 1 μm. In this way, the flexibility of the printed circuit board can be maintained well, and the characteristic impedance of the wiring patterns can be reduced.

(5) A method of manufacturing a printed circuit board according to another aspect of the invention includes the steps of forming a plurality of wiring patterns at prescribed intervals on one surface of an insulating layer, forming a thin metal film on the other surface of the insulating layer, and forming a plurality of ground patterns having a thickness larger than that of the thin metal film on the thin metal film so that the ground patterns are opposed to regions between the plurality of wiring patterns with the insulating layer and the thin metal film interposed therebetween.

In this method of manufacturing a printed circuit board, the thin metal film is formed on the other surface of the insulating layer, and the ground patterns are formed to be opposed to the regions between the plurality of wiring patterns with the insulating layer and the thin metal film interposed therebetween. Therefore, the flexibility of the printed circuit board can be secured and the characteristic impedance of the wiring patterns can be reduced.

The thin metal film is formed on the other surface of the insulating layer and the plurality of the ground patterns are formed on the thin metal film, so that variations in the characteristic impedance of the wiring pattern can be reduced and the printed circuit board can be bent in an arbitrary region.

(6) The step of forming the plurality of ground patterns may include providing the plurality of ground patterns not to be opposed to the plurality of wiring patterns. In this way, the flexibility of the printed circuit board can be more improved.

(7) The step of forming the plurality of wiring patterns may include forming the plurality of wiring patterns to extend in a stripe form on one surface of the insulating layer, and the step of forming the plurality of ground patterns may include forming the plurality of ground patterns to extend in a stripe form on the other surface of the insulating layer.

In this way, the thin metal film is formed on the other surface of the insulating layer, and the stripe-shaped ground patterns are formed to be opposed to the stripe-shaped regions between the plurality of stripe-shaped wiring patterns with the insulating layer and the thin metal film interposed therebetween. Therefore, the flexibility of the printed circuit board can be secured and the characteristic impedance of the wiring pattern can be reduced.

(8) The thickness of the thin metal film may be at most 1 μm. In this way, the flexibility of the printed circuit board can be maintained well and the characteristic impedance of the wiring pattern can be reduced.

Other features, elements, characteristics, and advantages of the present invention will become more apparent from the following description of preferred embodiments of the present invention with reference to the attached drawings.

DESCRIPTION OF THE PREFERRED EMBODIMENTS

Now, a flexible printed circuit board according to one embodiment of the invention will be described with reference to the drawings. Note that in the following description, the flexible printed circuit board will be abbreviated as "printed circuit board."

(1) STRUCTURE OF PRINTED CIRCUIT BOARD

Figure 1:
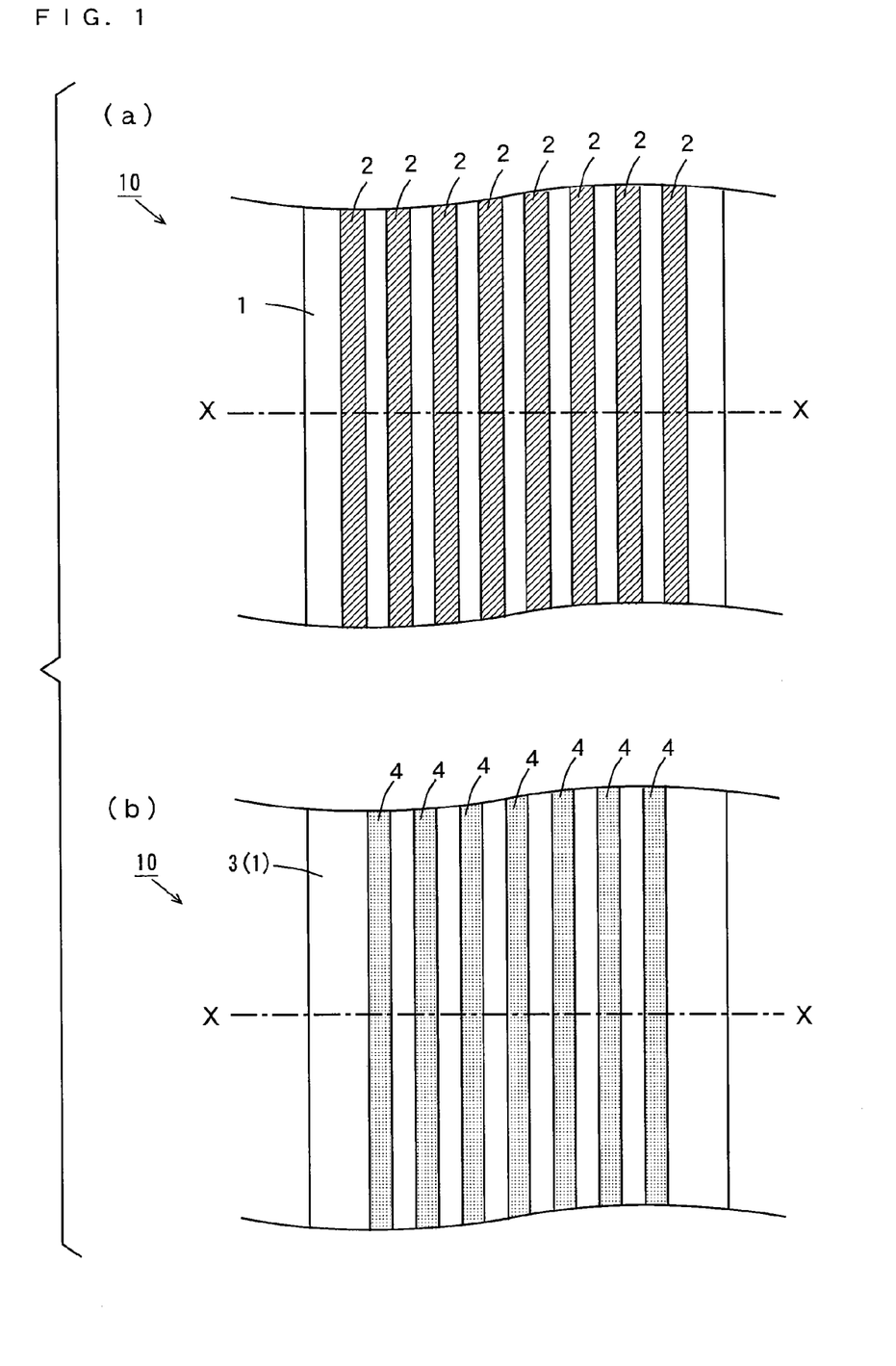
FIGS. 1 and 2 are views of the structure of a printed circuit board according to an embodiment of the invention.
Figure 2:
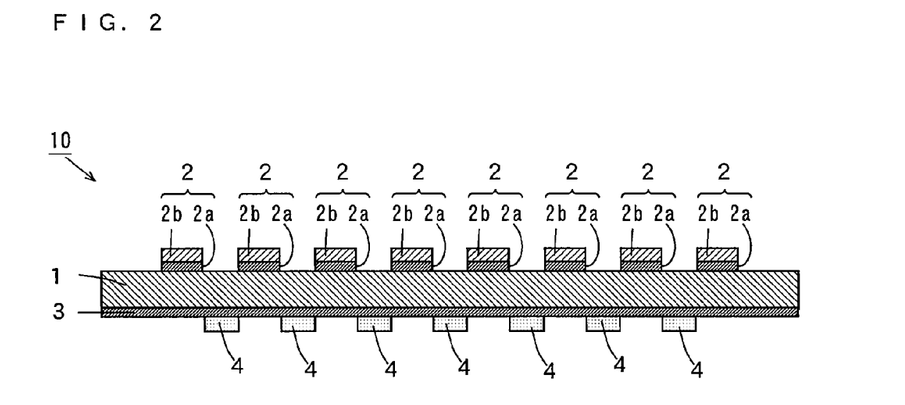

FIGS. 1 and 2 show the structure of the printed circuit board according to one embodiment of the invention. FIG. 1(*a*) is a plan view of one surface of the printed circuit board 10, and FIG. 1(*b*) is a plan view of the other surface of the printed circuit board 10. FIG. 2 is a sectional view of the printed circuit board 10 taken along line X-X in FIGS. 1(*a*) and 1(*b*).

As shown in FIGS. 1 and 2, a plurality of stripe-shaped wiring patterns 2 are arranged parallel to one another on one surface of a base insulating layer 1 made for example of polyimide. The wiring patterns 2 each have a layered structure including a conductive layer 2*a* made for example of chromium and copper and a wiring layer 2*b* made for example of copper. Note that the base insulating layer 1 corresponds to the insulating layer as recited in the claims.

Meanwhile, on the other surface of the base insulating layer 1, a thin metal film 3 made for example of chromium and copper is formed and a plurality of stripe-shaped ground patterns 4 made for example of copper are arranged parallel to one another on the thin metal layer 3.

The wiring patterns 2 and the ground patterns 4 described above are arranged in a staggered manner with the base insulating layer 1 interposed therebetween so that they are not opposed to each other. More specifically, the ground patterns 4 are formed to be opposed to the regions between the wiring patterns 2.

According to the embodiment, the thin metal film 3 and the ground patterns 4 form a ground layer.

Hereinafter, the surface of the base insulating layer 1 having the wiring patterns 2 formed thereon will be referred to as "the front surface" and the surface of the base insulating layer 1 having the ground patterns 4 formed thereon will be referred to as "the backside surface."

(2) METHOD OF MANUFACTURING PRINTED CIRCUIT BOARD

Figure 3:
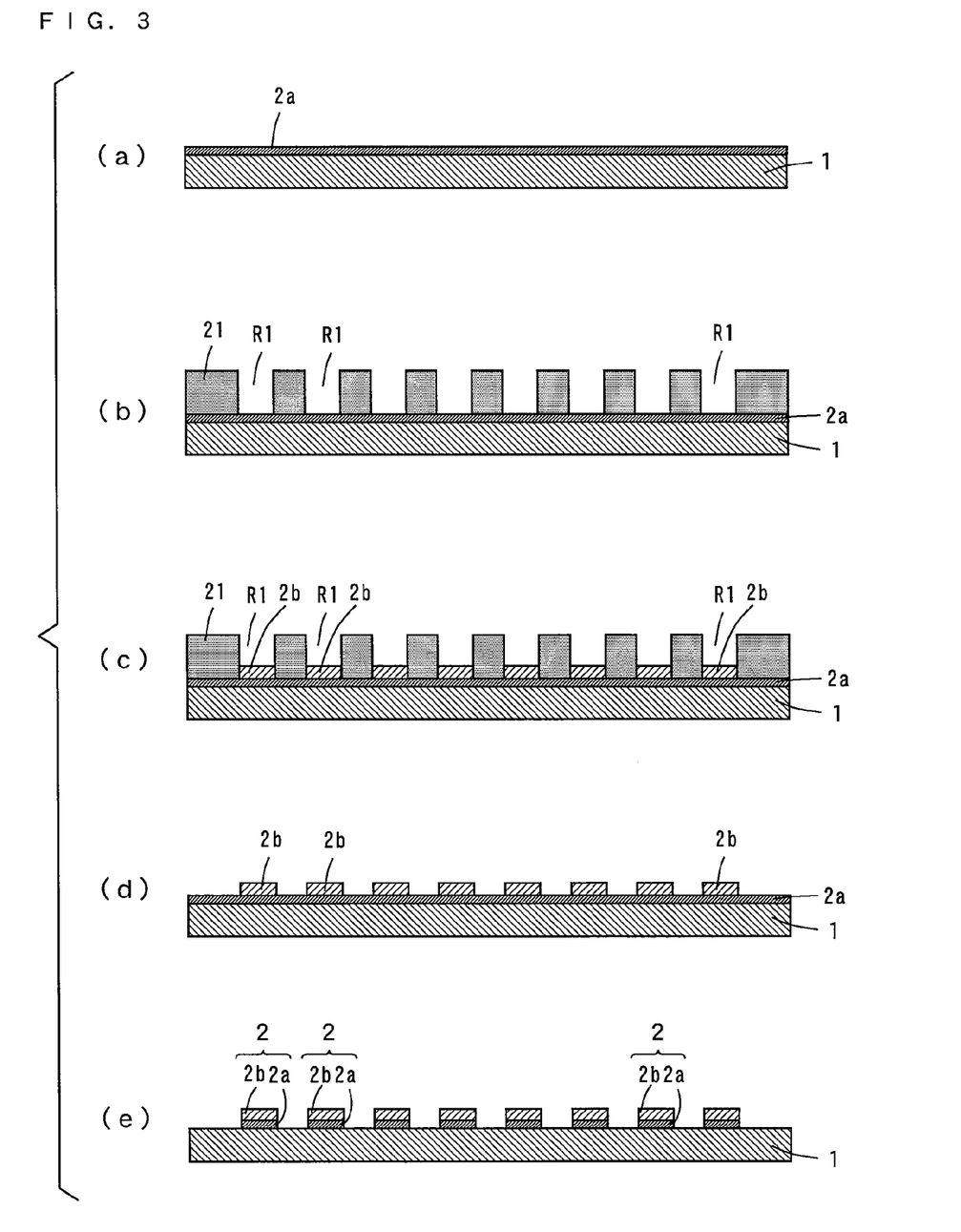
FIGS. 3 to 7 are views for use in illustrating a method of manufacturing a printed circuit board.
Figure 4:
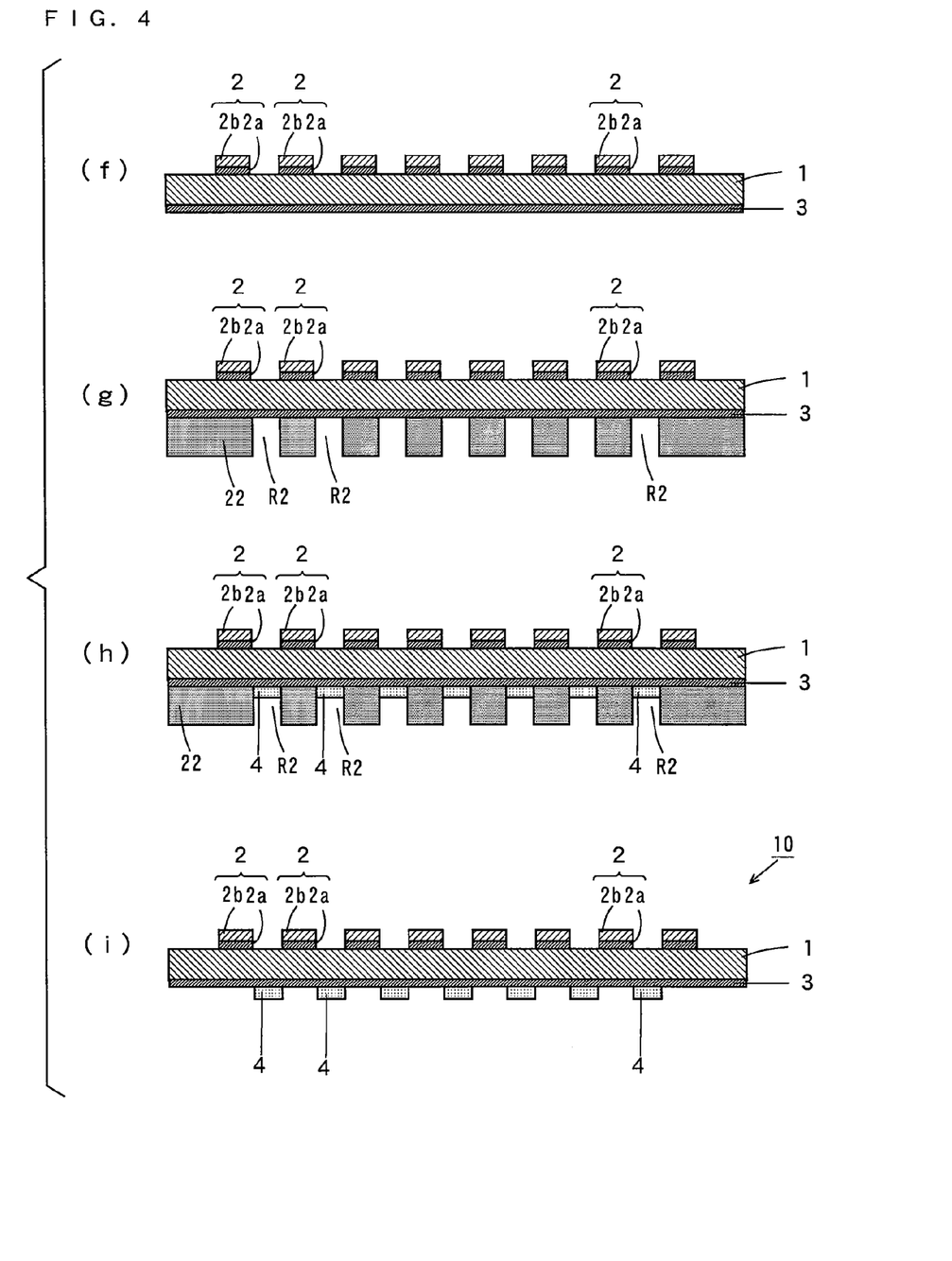

FIGS. 3 and 4 are sectional views for use in illustrating steps in a method of manufacturing the printed circuit board 10.

As shown in FIG. 3(a), a conductive layer 2a including layered films of chromium and copper is formed on the front surface of the base insulating layer 1 for example by sputtering.

Then, as shown in FIG. 3(b), a plating resist 21 having grooves R1 in a prescribed pattern is formed on the conductive layer 2a. The plating resist 21 is produced for example by forming a resist film on the conductive layer 2a using a dry film resist or the like, and exposing the resist film in a prescribed pattern, followed by development.

Then, as shown in FIG. 3(c), a wiring layer 2b is formed at the grooves R1 on the conductive layer 2a by electroplating. For example, copper is used for the wiring layer 2b.

Then, as shown in FIG. 3(d), the plating resist 21 is removed by chemical etching (wet etching) or peeling. Then, as shown in FIG. 3(e), the exposed region of the conductive layer 2a is etched away. In this way, a plurality of wiring patterns 2 made of the conductive layer 2a and the wiring layer 2b are formed (see FIGS. 1 and 2).

As shown in FIG. 4(f), a thin metal film 3 including layered films of chromium and copper is formed on the backside surface of the base insulating layer 1 for example by sputtering.

Then, as shown in FIG. 4(g), a plating resist 22 having grooves R2 in a prescribed pattern is formed on the thin metal film 3. The plating resist 22 is formed by forming a resist film on the thin metal film 3 using a dry film resist or the like and exposing the resist film in a prescribed pattern, followed by development.

Note that the grooves R2 of the plating resist 22 are formed in a region not opposing the wiring patterns 2 with the base insulating layer 1 therebetween.

Then, as shown in FIG. 4(h), ground patterns 4 are formed at the grooves R2 on the thin metal film 3 by electroplating. The ground pattern 4 is made for example of copper.

Then as shown in FIG. 4(i), the plating resist 22 is removed by chemical etching (wet etching) or peeling. In this way, the printed circuit board 10 as shown in FIGS. 1 and 2 is completed.

(2-a) Another Manufacturing Method

In the method of manufacturing the printed circuit board 10 shown in FIGS. 3 and 4, the wiring patterns 2 are formed by a semi-additive method, but the wiring patterns 2 may be formed by a subtractive method.

Figure 5:
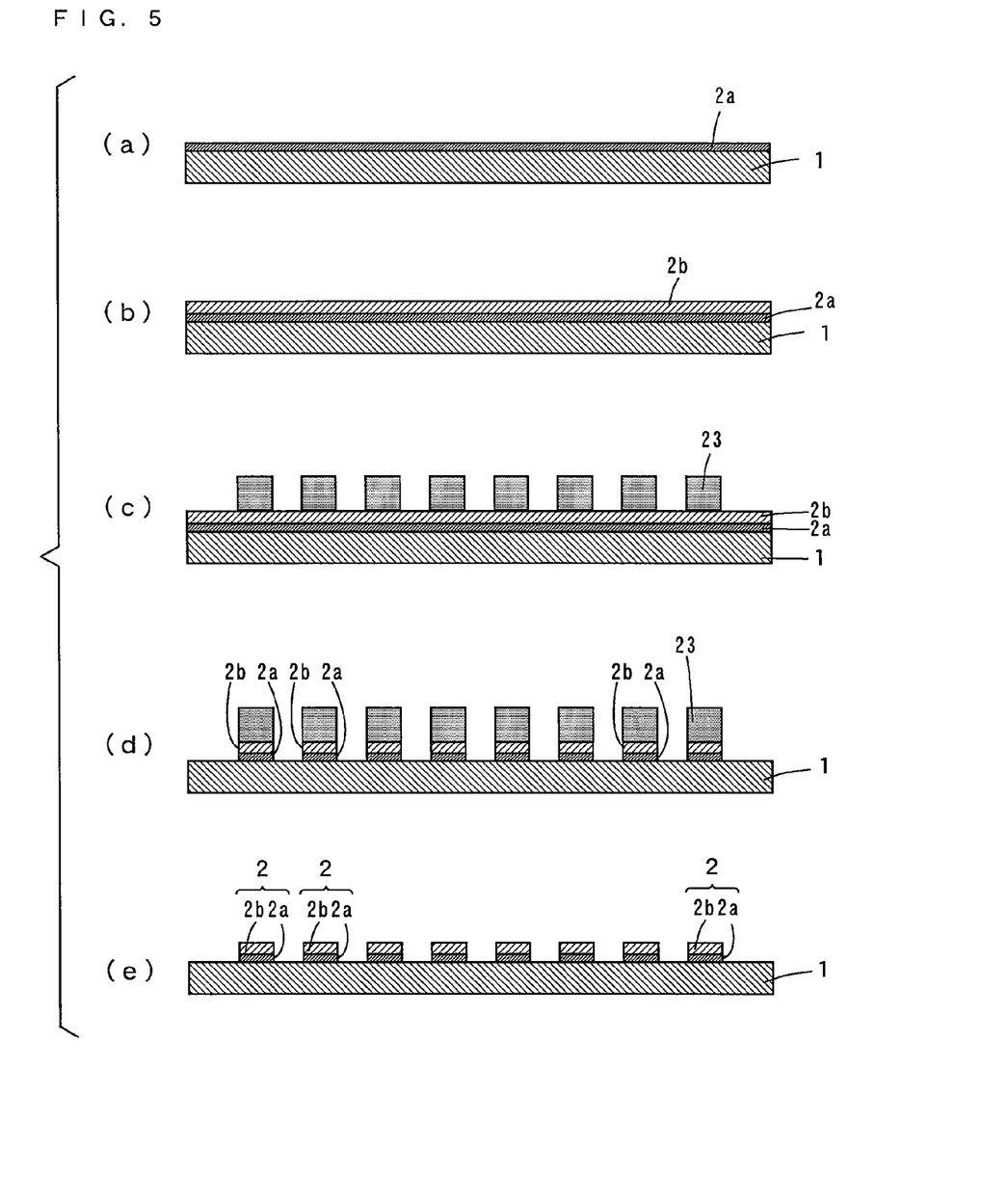

FIG. 5 is a sectional view for use in illustrating steps in another method of manufacturing the printed circuit board 10.

As shown in FIG. 5(a), a conductive layer 2a including layered films of chromium and copper is formed on the front surface of a base insulating layer 1 for example by sputtering.

Then, as shown in FIG. 5(b), a wiring layer 2b made for example of copper is formed on the conductive layer 2a by electroplating.

Then, as shown in FIG. 5(c), an etching resist 23 having a prescribed pattern is formed on the wiring layer 2b. The etching resist 23 is formed for example by forming a resist film on the wiring layer 2b using a dry film resist or the like, and exposing the resist film in a prescribed pattern, followed by development.

Then, as shown in FIG. 5(d), the region of the conductive layer 2a and the wiring layer 2b excluding the region under the etching resist 23 is removed by etching. Then, as shown in FIG. 5(e), the etching resist 23 is removed by a release agent. In this way, a plurality of wiring patterns 2 made of the conductive layer 2a and the wiring layer 2b are formed.

Thereafter, the same steps as those in FIGS. 4(f) to 4(i) are carried out and the printed circuit board 10 is completed.

(2-b) Yet Another Manufacturing Method

In the methods of manufacturing the printed circuit board 10 shown in FIGS. 3 to 5, the ground patterns 4 are formed by electroplating, but the ground patterns 4 may be formed by sputtering.

Figure 6:
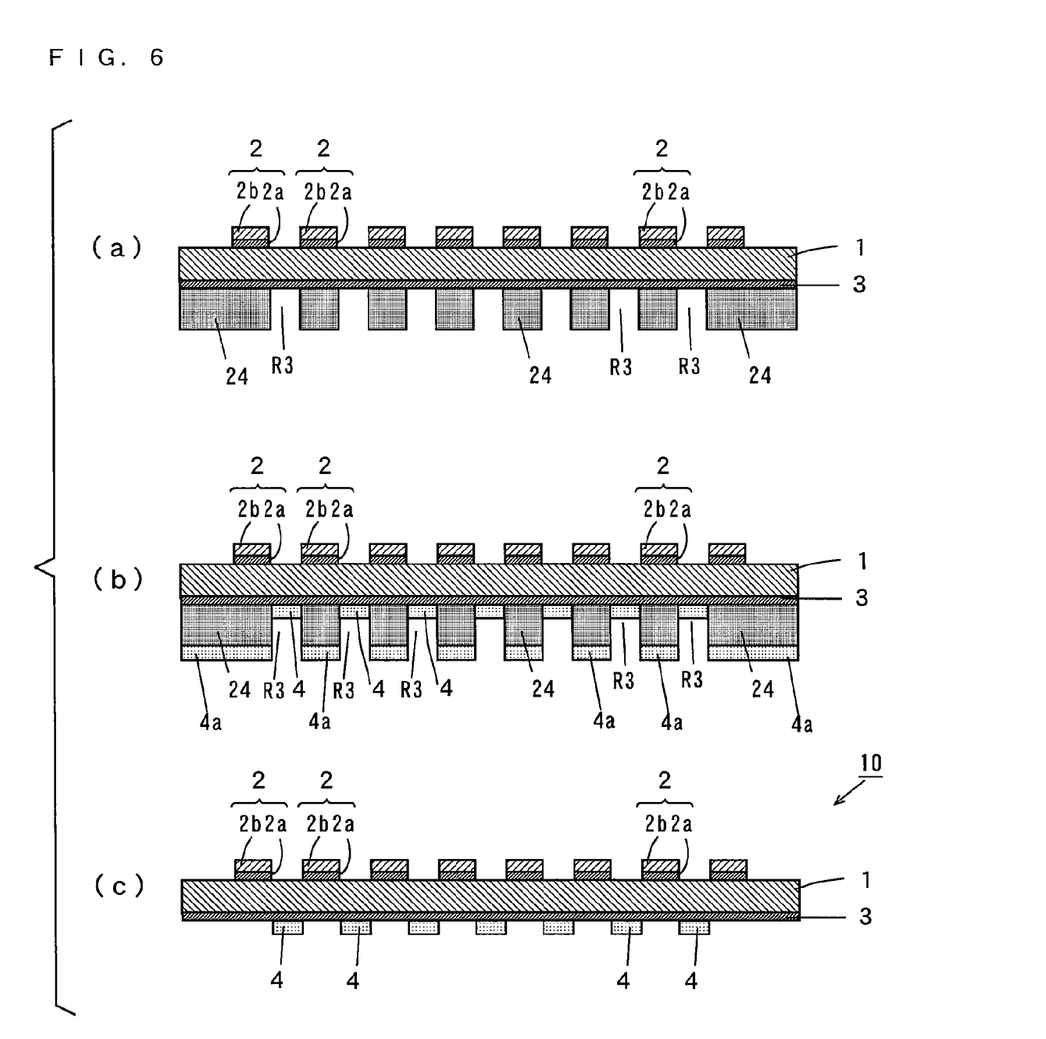

FIG. 6 is a sectional view for use in illustrating steps in yet another method of manufacturing the printed circuit board 10.

Wiring patterns 2 are formed on the front surface of the base insulating layer 1 by the steps shown in FIGS. 3(a) to 3(e) or the steps shown in FIGS. 5(a) to 5(e). Then, a thin metal film 3 is formed on the backside surface of the base insulating layer 1 by the step shown in FIG. 4(f).

Then, as shown in FIG. 6(a), a sputtering resist 24 having grooves R3 in a prescribed pattern is formed on the thin metal film 3. The sputtering resist 24 is formed for example by forming a resist film on the thin metal film 3 using a dry film resist or the like and exposing the resist film in a prescribed pattern, followed by development. Note that the grooves R3 of the sputtering resist 24 are formed into the same region as that of the grooves R2 of the plating resist 22 shown in FIG. 4(g).

As shown in FIG. 6(b), ground patterns 4 are formed in the grooves R3 by sputtering. At the time, a sputtering layer 4a of the same material as that of the ground pattern 4 is formed on the sputtering resist 24.

Then, as shown in FIG. 6(c), the sputtering resist 24 and the sputtering layer 4a on the sputtering resist 24 are removed by a release agent. In this way, the ground patterns 4 are formed on the thin metal film 3 and the printed circuit board 10 is completed.

Note that the thickness of the thin metal film 3 is preferably in the range from 0.05 µm to 1 µm. In this way, the flexibility of the printed circuit board 10 can be maintained well while the characteristic impedance of the wiring pattern 2 can be reduced.

The thickness of the wiring pattern 2 is preferably in the range from 5 µm to 25 µm. The total thickness of the thin metal film 3 and the ground pattern 4 is preferably in the range from 5 µm to 25 µm.

As shown in FIGS. 3 to 6, in the methods of manufacturing the printed circuit board 10, it is preferred that the wiring patterns 2 are formed on the front surface of the base insulating layer 1, and then the thin metal film 3 and the ground patterns 4 are formed on the backside surface, while the thin metal film 3 and the ground patterns 4 may be formed on the backside surface of the base insulating layer 1 and then the wiring pattern 2 may be formed on the front surface.

(3) EFFECTS OF THE EMBODIMENT

According to the embodiment, the thin metal film 3 is formed on the backside surface of the base insulating layer 1, and the ground patterns 4 are formed to be opposed to the regions between the wiring patterns 2. In this way, the flexibility of the printed circuit board 10 can be secured and the characteristic impedance of the wiring pattern 2 can be reduced.

On the backside surface of the base insulating layer 1, the plurality of ground patterns 4 are formed on the thin metal film 3, therefore variations in the characteristic impedance of the wiring pattern 2 can be reduced, and the printed circuit board 10 can be bent in an arbitrary region.

(4) OTHER EMBODIMENTS

According to the above-described embodiment, the ground patterns 4 are provided to be opposed to the regions between the wiring patterns 2 and not to be opposed to the wiring patterns 2. However, a part of the ground patterns 4 may be opposed to the wiring patterns 2 if the printed circuit board 10 has sufficient flexibility.

For example, a lattice-shaped or slit-shaped opening may be formed in the thin metal film 3. In this way, the number of openings or the size of the opening may be adjusted to adjust the area of the region in which the wiring patterns 2 are opposed to the thin metal film 3.

In this case, as described above, the characteristic impedance of the wiring pattern 2 depends on the area of the region in which the wiring patterns 2 and the ground layer (the thin metal film 3 and the ground patterns 4) are opposed to each other.

Therefore, the number of openings or the size of the opening may be adjusted to adjust the characteristic impedance of the wiring pattern 2. In this way, the characteristic impedance of the wiring pattern 2 may be matched to the input/output impedance of any of various electronic parts.

However, if the openings are formed irregularly in the thin metal film 3, the characteristic impedance of the wiring pattern 2 varies. Therefore, the openings are preferably formed regularly and equally in the thin metal film 3.

A cover layer of the above-described insulating material may be formed to cover the wiring patterns 2. Similarly, a cover layer of the above-described insulating material may be formed to cover the ground patterns 4. In this way, the wiring patterns 2 or the ground patterns 4 may be prevented from being damaged.

The material of the base insulating layer 1 is not limited to polyimide but examples of the insulating material may include a polyethylene terephthalate film, a polyethernitrile film, and a polyethersulfone film.

The material of wiring pattern 2 and the ground pattern 4 is not limited to copper but examples of the metal material may include a copper alloy, gold, and aluminum. The material of the wiring pattern 2 may be different from the material of the ground pattern 4.

The thin metal film 3 is not limited to a film having such a two-layer structure of chromium and copper but may have for example a single-layer structure of copper alone.

The conductive layer 2a is not limited to a film having such a two-layer structure of chromium and copper, but may have for example a single-layer structure of copper alone.

If the wiring layer 2b is formed by a method other than by electroplating, the conductive layer 2a does not have to be formed.

Figure 7:
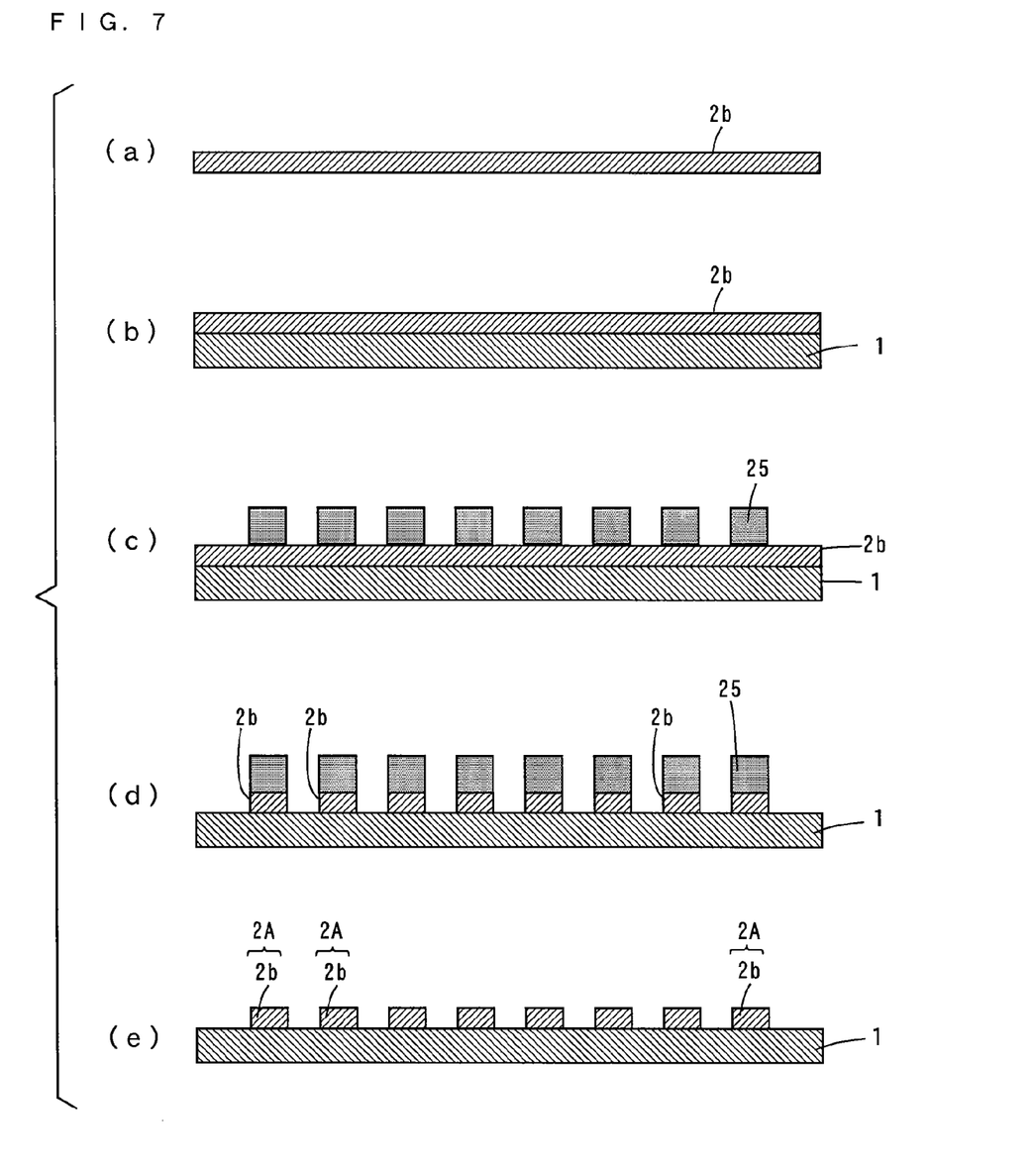

Now, a method of forming a wiring pattern without forming the conductive layer 2a will be described. FIG. 7 is a sectional view for use in illustrating steps in this alternative method of forming wiring patterns.

To start with, as shown in FIG. 7(a), a thin film type wiring layer 2b is prepared. Then, as shown in FIG. 7(b), a base insulating layer 1 is formed on one surface (the backside surface) of the wiring layer 2b for example by lamination or application.

As shown in FIG. 7(c), an etching resist 25 having a prescribed pattern is formed on the other surface (the front surface) of the wiring layer 2b. Then, as shown in FIG. 7(d), the region of the wiring layer 2b excluding the region under the etching resist 25 is removed by etching.

Then, as shown in FIG. 7(e), the etching resist 25 is removed by a release agent. In this way, a plurality of wiring patterns 2A formed only of the wiring layer 2b are formed.

As described above, when the layered structure including the wiring layer 2b and the base insulating layer 1 is formed for example by lamination or application, the conductive layer 2a does not have to be formed.

(5) EXAMPLES

Inventive Example

In Inventive Example, a printed circuit board having the structure shown in FIGS. 1 and 2 was produced.

Note that the thickness of the base insulating layer 1 was 25 μm and the thickness of the wiring pattern 2 was 18 μm. The thickness of the thin metal film 3 was 1 μm and the thickness of the ground pattern 4 was 17 μm.

Comparative Example

In Comparative Example, a printed circuit board having the same structure as that of Inventive Example except that the thin metal film 3 was not formed was produced.

Evaluation

An electronic component whose input/output impedance was 50Ω was connected to the printed circuit boards according to Inventive Example and Comparative Example and used. The reflection of electrical signals was examined.

When the electronic component was connected to the printed circuit board according to Inventive Example and used, there was no reflection of an electrical signal. In contrast, when the electronic component was connected to the printed circuit board according to Comparative Example and used, an electrical signal was reflected.

The printed circuit boards according to Inventive Example and Comparative Example were examined for the characteristic impedance of their wiring patterns 2. As a result, the characteristic impedance of the wiring pattern 2 in the printed circuit board according to Inventive Example was about 50 Ω, while the characteristic impedance of the wiring pattern 2 in the printed circuit board according to Comparative Example was about 80Ω.

As in the foregoing, it was found that by forming the thin metal film 3 as well as the ground patterns 4 on the backside surface of the base insulating layer 1, the characteristic impedance of the wiring pattern 2 could sufficiently be reduced.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board, comprising:
    an insulating layer;
    a plurality of wiring patterns formed at prescribed intervals on one surface of said insulating layer;
    a thin metal film formed on the other surface of said insulating layer; and
    a plurality of ground patterns formed at prescribed intervals on said thin metal film and having a thickness larger than that of said thin metal film,
    said plurality of ground patterns being provided to be opposed to regions between said plurality of wiring patterns with said insulating layer and said thin metal film interposed therebetween.

2. The printed circuit board according to claim 1, wherein said ground patterns are provided not to be opposed to said plurality of wiring patterns.

3. The printed circuit board according to claim 1, wherein said plurality of wiring patterns extend in a stripe form on said one surface of said insulating layer, and said plurality of ground patterns extend in a stripe form on said other surface of said insulating layer.

4. The printed circuit board according to claim 1, wherein the thickness of said thin metal film is at most 1 μm.

5. A method of manufacturing a printed circuit board, comprising the steps of:

forming a plurality of wiring patterns at prescribed intervals on one surface of an insulating layer;

forming a thin metal film on the other surface of said insulating layer; and forming a plurality of ground patterns having a thickness larger than that of said thin metal film at prescribed intervals on said thin metal film so that said ground patterns are opposed to regions between said plurality of wiring patterns with said insulating layer and said thin metal film interposed therebetween.

6. The method of manufacturing a printed circuit board according to claim 5, wherein the step of forming said plurality of ground patterns includes providing said plurality of ground patterns not to be opposed to said plurality of wiring patterns.

7. The method of manufacturing a printed circuit board according to claim 5, wherein said step of forming said plurality of wiring patterns includes forming said plurality of wiring pattern to extend in a stripe form on said one surface of said insulating layer, and said step of forming said plurality of ground patterns includes forming said plurality of ground patterns to extend in a stripe form on said other surface of said insulating layer.

8. The method of manufacturing a printed circuit board according to claim 5, wherein the thickness of said thin metal film is at most 1 μm.

* * * * *